United States Patent
Mani

(10) Patent No.: US 9,349,429 B2
(45) Date of Patent: *May 24, 2016

(54) FIELD PROGRAMMING METHOD FOR MAGNETIC MEMORY DEVICES

(71) Applicant: III Holdings 1, LLC, Wilmington, DE (US)

(72) Inventor: Krishnakumar Mani, San Jose, CA (US)

(73) Assignee: III HOLDINGS 1, LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/321,397

(22) Filed: Jul. 1, 2014

(65) Prior Publication Data

US 2014/0313820 A1    Oct. 23, 2014

Related U.S. Application Data

(63) Continuation of application No. 13/311,453, filed on Dec. 5, 2011, now Pat. No. 8,767,435.

(60) Provisional application No. 61/419,379, filed on Dec. 3, 2010.

(51) Int. Cl.
*G11C 11/16* (2006.01)
*G11C 17/02* (2006.01)

(52) U.S. Cl.
CPC ............ *G11C 11/1675* (2013.01); *G11C 11/16* (2013.01); *G11C 11/165* (2013.01); *G11C 11/1673* (2013.01); *G11C 17/02* (2013.01)

(58) Field of Classification Search
CPC ........... G11C 11/1675; G11C 11/1673; G11C 11/16; G11C 11/165; G11C 17/02
See application file for complete search history.

(56) References Cited

U.S. PATENT DOCUMENTS

| 6,324,093 | B1 | 11/2001 | Perner et al. | |
|---|---|---|---|---|
| 7,110,290 | B2 | 9/2006 | Ooishi | |
| 7,796,421 | B2 | 9/2010 | Mani | |
| 7,911,854 | B2 * | 3/2011 | Nagashima et al. | 365/189.06 |
| 8,347,175 | B2 * | 1/2013 | Ikegawa et al. | 714/758 |
| 2010/0091546 | A1 * | 4/2010 | Liu et al. | 365/97 |

* cited by examiner

*Primary Examiner* — Vanthu Nguyen
(74) *Attorney, Agent, or Firm* — McAndrews, Held & Malloy, Ltd.

(57) ABSTRACT

There is provided a method for operating a magnetic memory device. The method comprises selecting a subset of magnetic memory cells of the magnetic memory device; applying a first programming voltage to the selected subset of cells for a predetermined amount of time, wherein the programming voltage is selected to exceed a threshold operating voltage thereby to cause irreversible breakdown of the subset of cells; and reading selected cells of the magnetic memory device by passing a read current through a diode connected in series with each magnetic memory cell.

19 Claims, 3 Drawing Sheets

FIELD PROGRAMMING METHOD FOR MAGNETIC MEMORY DEVICES

This application is a continuation of U.S. patent application Ser. No. 13/311,453 filed Dec. 05, 2011, which claims the benefit of priority to U.S. Provisional Patent Application Ser. No. 61/419,379 filed Dec. 03, 2010, the entire specification of each of the above applications is incorporated herein by reference.

FIELD

Embodiments of the present invention relate to a field programming method for magnetic memory devices.

BACKGROUND

Magnetic memory circuits are based on the magneto-resistive behavior of magnetic storage elements that are integrated typically with a complementary metal-oxide-semiconductor (CMOS) technology. Such memory circuits generally provide non-volatility and an unlimited read and write capability. An example is the magnetic random access memory (MRAM) circuit that includes a plurality of memory cells, each defining an addressable magnetic storage element that may include a magnetic tunnel junction (MTJ) stack.

Each addressable MTJ stack can have a magnetic spin orientation and can be flipped between two states by the application of a magnetic field that is induced by energizing corresponding bit and word lines.

FIG. 1A illustrates a plan view of a section of an exemplary array 100 of memory cells X 112 in a magnetic random access memory (MRAM) circuit, that includes a set of longitudinal word lines (WL) 102 and a set of transverse bit lines (BL) 104. The set of BL 104 overlies the set of WL 102 to define crossover zones 108. An addressable MTJ stack 110 is disposed within each crossover zone 108. Current drivers 106 are provided for energizing the BL 104 and the WL 102. An address transistor (not shown) is provided under each MTJ stack 110 and in the memory cell X 112, for reading the state of the MTJ stack 110.

FIG. 1B illustrates a partly schematic and partly cross-sectional view of the memory cell X 112 in FIG. 1A. As shown in the cross-sectional view, the MTJ stack 110 is disposed within the crossover zone 108. The address transistor 132 is shown schematically. Generally, the MTJ stack 110 is designed to be integrated into a back-end metallization structure following a front-end CMOS processing. The MTJ stack 110 is shown to be provided between a first metallization layer Mx and a second metallization layer My, wherein the MTJ stack 110 is connected to the first layer Mx through a via hole 128 and to the second layer My through a via hole 116. The second layer My is patterned to include the BL 104. The MTJ stack 110 includes a free layer 118, a tunnel oxide layer 120, a fixed layer 122 and an extended bottom electrode 124. The first layer Mx is patterned to include the WL 102 for writing into the MTJ stack 110. The address transistor 132 is connected to the first layer Mx by a connection 130a. A read word line (WL) 130b in the first layer Mx is usable for selectively operating the address transistor 132. The WL 102 has no contact with the bottom electrode 124, and when energized, induces a magnetic field within the MTJ stack 110.

A write operation in a selected memory cell X 112 in the array 100 can be performed by energizing the corresponding BL 104 and the WL 102, to generate a changing the magnetic state of the corresponding MTJ stack 110. For a read operation, a voltage is applied to the BL 104 of the selected memory cell X 112, so that a current can flow through the corresponding MTJ stack 110 and the address transistor 132 that is selectively switched on by the WL 130b. The magnitude of the current sensed indicates the conductivity or the magnetic state of the MTJ stack 110.

SUMMARY

According to a first aspect of the invention, there is provided a method for operating a magnetic memory device. The method may comprise selecting a subset of magnetic memory cells of the magnetic memory device; applying a first programming voltage to the selected subset of cells for a predetermined amount of time, wherein the programming voltage is selected to exceed a threshold operating voltage thereby to cause irreversible breakdown of the subset of cells; and reading selected cells of the magnetic memory device by passing a read current through a diode connected in series with each magnetic memory cell.

Each magnetic memory cell may comprise a magneto-resistive element. Each magneto-resistive element may comprise a Magnetic Tunnel Junction (MTJ).

In the case of a programming error, the method may comprise applying the programming voltage for the predetermined amount of time to the cells that were not selected; and applying a second programming voltage to the selected subset of cells for a predetermined amount of time; wherein the second programming voltage is greater than the first programming voltage.

According to a second aspect of the invention, there is provided a magnetic memory device, comprising a plurality of magnetic memory cells, a read circuit comprising a plurality of diodes, each connected in series with one of the plurality of magnetic memory cells; and data programmed into the plurality of magnetic memory cells, wherein the data resides in a first subset of the magnetic memory cells and a second subset of magnetic memory cells, said first subset of magnetic memory cells having a characteristic default resistance and said second subset of magnetic memory cells having a characteristic altered resistance; wherein said default and altered resistances are capable of being read by a read current passed through the read circuit as one of a logical high and a logical low.

Each magnetic memory cell may comprise a magneto-resistive element. Each magneto-resistive element may comprise a Magnetic Tunnel Junction (MTJ).

The default resistance may be a property each magnetic memory cell as manufactured.

The altered resistance may be a property of each magnetic memory cell of the second subset after a first programming voltage has been applied to the magnetic memory cell for a predetermined amount of time.

The first programming voltage may be selected to exceed a threshold operating voltage of the magnetic memory cells of the first subset thereby to cause irreversible breakdown of said magnetic memory cells.

According to a third aspect of the invention, there is provided an electronic device, comprising: a control element; and a magnetic memory device coupled to the control element, the magnetic memory device comprising: a plurality of magnetic memory cells, a read circuit comprising a plurality of diodes, each connected in series with one of the plurality of magnetic memory cells; and data programmed into the plurality of magnetic memory cells, wherein the data resides in a first subset of the magnetic memory cells and a second subset of magnetic memory cells, said first subset of magnetic memory cells having a characteristic default resistance and said second subset of magnetic memory cells having a characteristic altered resistance; wherein said default and altered resistances are capable of being read by a read current passed through the read circuit as one of a logical high and a logical low.

The control element may be one of a micro-controller and a Central Processing Unit (CPU).

The electronic device may be in the form of one of a mobile phone, tablet computer, laptop computer, digital camera, and a desktop computer.

Other aspects of the invention will become apparent from the written description below.

DETAILED DESCRIPTION

Figure 1A:
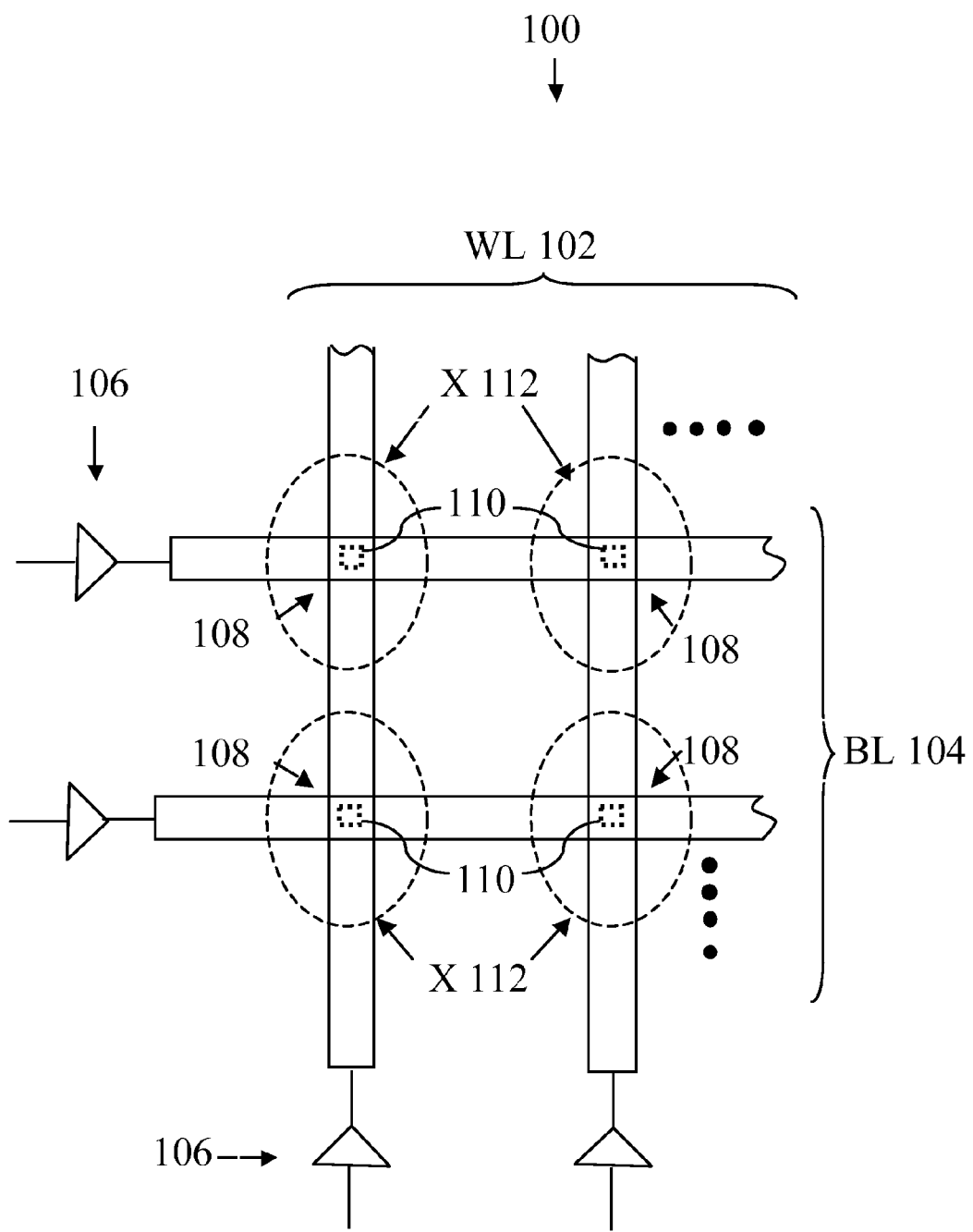
FIG. 1A illustrates a plan view of a section of an exemplary array of memory cells in a magnetic random access memory (MRAM) circuit.
Figure 1B:
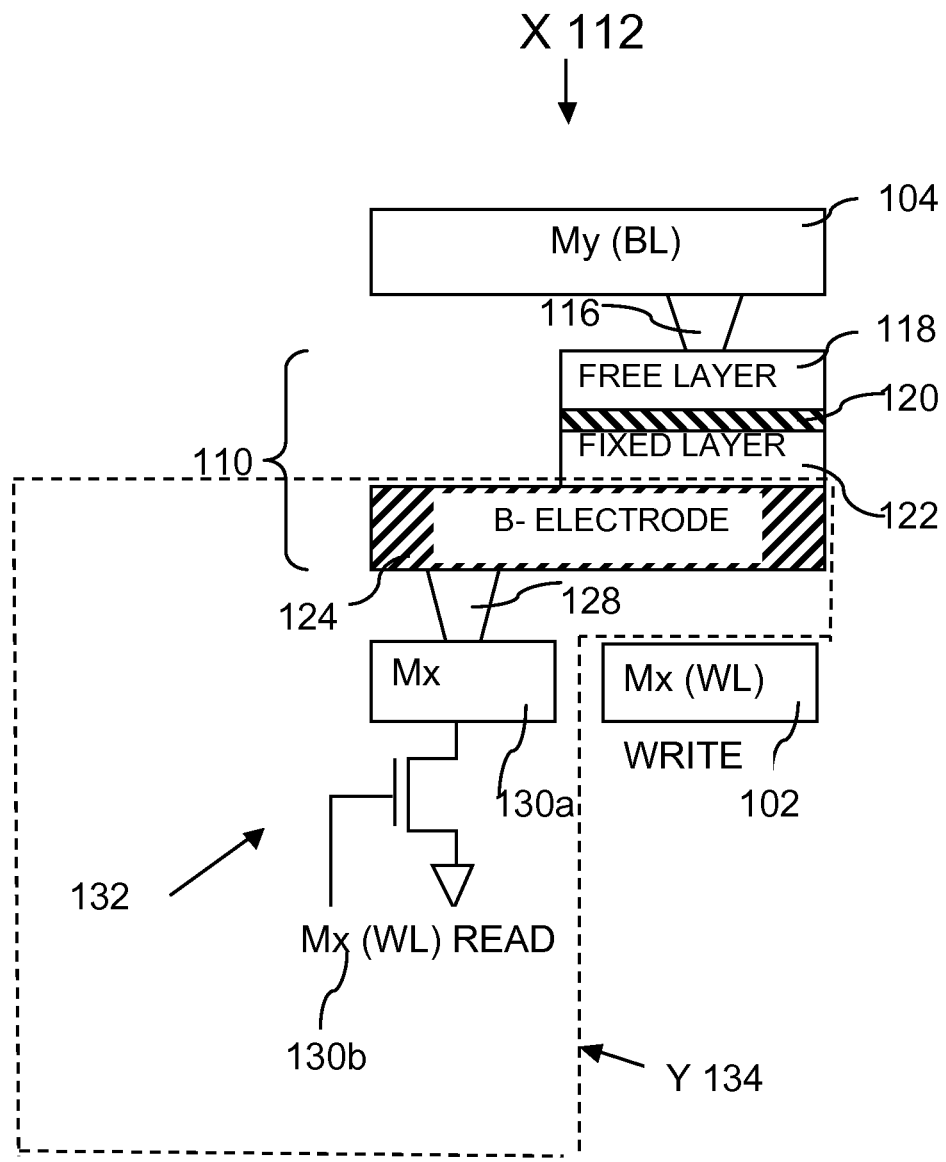
FIG. 1B illustrates a partly schematic and partly cross-sectional view of a memory cell described in FIG. 1A, with the memory cell including a magnetic tunnel junction (MTJ) stack.

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Broadly, embodiments of the present invention disclose a field programming method for programming a magnetic memory device. As used herein, the term "magnetic memory device" refers to a broad class of memory devices that use a magnetic storage element or bit for data storage. A Magnetic Random Access Memory (MRAM) device that uses a MTJ as the magnetic storage element is one example of a magnetic memory device and will be the exemplary device used in the rest of this description to illustrate aspects of the present invention. However, it is to be understood that the aspects of the invention thus disclosed may equally be applied to any other type of magnetic memory devices from the class of magnetic memory devices.

As will understood by one skilled in the art, a MRAM device, when it leaves a production line will typically comprise an array of magnetic storage elements (MTJs) coupled to addressing logic and read/write circuitry. Typically all the magnetic storage elements will have a default resistance defined by the properties of the magnetic storage elements. Thus, it is expected that all the magnetic storage elements will have the same default resistance.

One skilled in the art will also understand that each of the magnetic storage elements will have the same threshold operating voltage. Generally, during operation the threshold operating voltage is never exceeded.

In one embodiment, the programming method disclosed herein comprises selecting a subset of the magnetic storage elements/cells of a MRAM device/circuit and deliberately subjecting those cells to a programming voltage (Vpp) that exceeds the threshold operating voltage. The programming voltage is applied for a predetermined amount of time and the effect is that irreversible breakdown of the magnetic storage elements that are subjected to the programming voltage (Vpp) occurs. Because of this irreversible breakdown, the magnetic storage elements that were subjected to the programming voltage (Vpp) will now have an altered resistance that is different than the original default voltage. Advantageously, the resistance of the magnetic storage elements, whether default or altered, can be sensed be a simplified/compact read circuit that comprises a single diode connected in series to each magnetic storage element.

Figure 2:
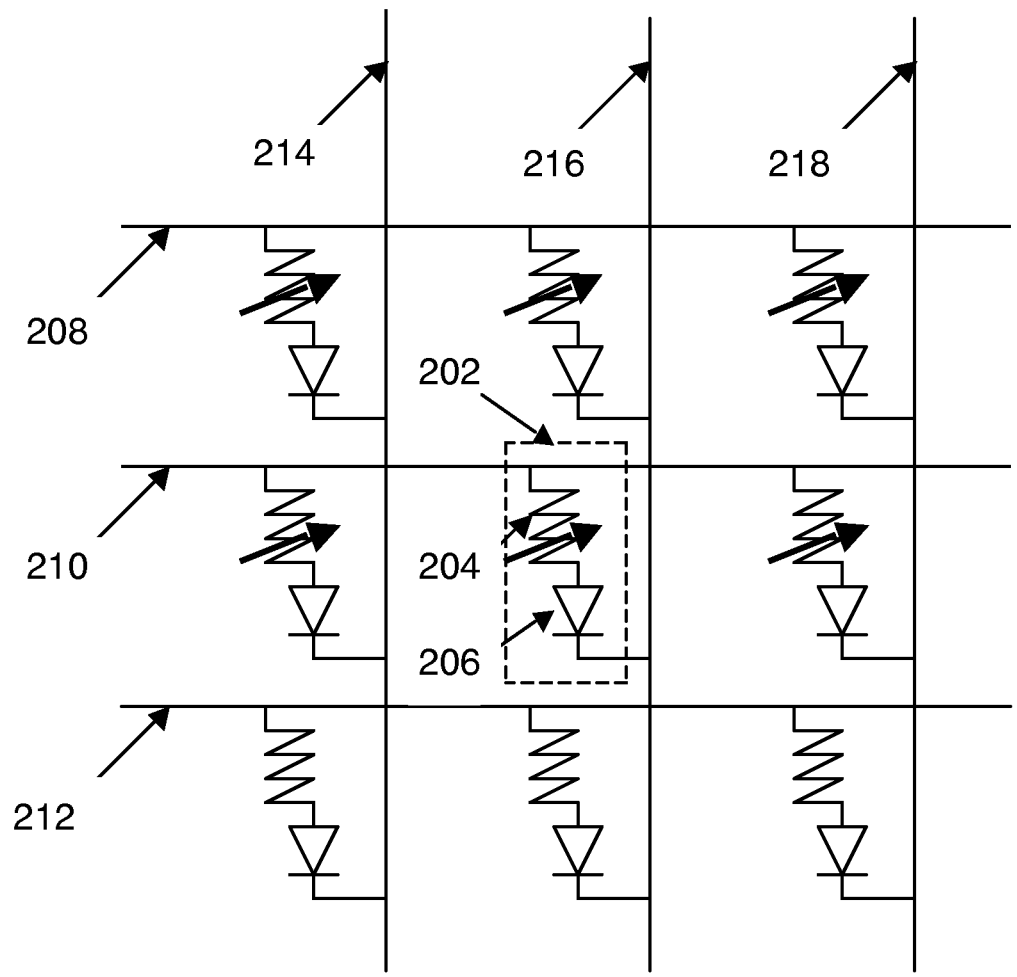
FIG. 2 shows a 3×3 memory array having 9-bits, in accordance with one embodiment of the invention.

Aspects of the programming method of the present invention will now be described with reference to FIG. 2 of the drawings, which shows a MRAM array 200, in accordance with one embodiment of the invention. The MRAM array 200 comprises a 3×3 array of magnetic storage elements. It is to be understood that the invention is not limited to a 3×3 array as other array sizes are possible. The array 200 comprises a plurality of magnetic storage elements/memory cells, e.g. the cell 202 shown in FIG. 2. Each cell comprises a magneto-resistive element. In accordance with difference embodiments of the invention, the magneto-resistive element may comprise a Giant magnetoresistance (GMT) stack or a Tunnel magnetoresistance (TMR) stack. In FIG. 2, the GMR or TMR stack is shown as variable resistor 204. As will be seen, each stack is connected in series with a diode shown as 206, which forms part of a read circuit (not shown). The 3×3 array comprises three word lines (208, 210, 212) and three bit lines (214, 216, 218) disposed so that a memory cell lies at each of the intersections of word lines and bit lines. The magnetic memory cells as fabricated each have a fixed or default resistance which can be sensed by a read circuit as a logical high or a "1".

When a voltage above a critical or threshold operating voltage, typically above 3V, is applied across the selected memory cell for a predetermined amount of time, the resistance value of the magnetic memory cell is reduced or altered. Cells with the altered resistance can be read by passing a read current through the read circuit as a logical low or a "0".

For writing to memory array, the cells that need to be sensed as a logical low are selected and then the programming voltage is applied to the selected cells as described above. The memory cell 202 is written by applying a voltage above the threshold operating voltage between line 210 and line 216 where line 216 is at ground potential. The unselected lines 208 and 208 can have zero volts applied to them. At the same time zero volts is applied to line 216, whereas lines 214 and 218 can be left floating. When the voltage above the threshold operating voltage is applied to line 210, the default resistance value exhibited by magnetic stack (resistor 204) in bit cell 202 undergoes reduction.

Since the programming method disclosed herein is voltage-based as opposed to current-based, the circuitry required to apply the programming voltage to the selected cells is much simpler than current drivers used in traditional MRAM memories. This results in smaller and more cost effective MRAM memories. One additional benefit of memory disclosed herein is that the operating voltage can be applied across a selected magnetic stack during the write operation from a pin other than VDD. Another high voltage pin, such as VPP, may be employed to provide the programming voltage. This allows for scaling down of regular VDD supply voltage, without compromising higher voltage requirement for write operations.

The voltage used during read operations are similar to that used for write operations, except that bias voltage applied to selected word line 210 is of lower value, typically about 1V. Sensing circuitries are well known in the art, which can detect change of resistance to determine "0" or "1" state of bit cell. The voltage for write and read operations described herein are one illustration of how to implement this invention. It will be obvious to those knowledgeable in the field that same invention can be easily implemented by different variants of voltage conditions.

The programming method disclosed herein is ideally intended to by used only once. However, in the case of programming errors, it may be possible to "erase" or "reset" the memory so that the programming method may be applied de novo, To erase/reset the memory, a first programming voltage is applied to the remainder cells in the memory array that were not selected during the first write operation. Thus, all the cells will now have a new default resistance. The programming method can now be applied to apply a new and higher programming voltage to selected cells, as described above.

Embodiments of the present invention also cover a magnetic memory circuit/device that includes cells with data programmed in accordance with the programming method disclosed herein.

Embodiments of the present invention also cover electronic devices with a control element (micro-controller or Central Processing Unit (CPU)) coupled to a magnetic memory circuit/device that includes cells with data programmed in accordance with the programming method disclosed herein. Examples of such electronic devices include mobile phones, tablet computers, laptop computers, digital cameras, desktop computers, etc.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A method for operating a magnetic memory device, the method comprising:
   selecting a first subset of magnetic memory cells of the magnetic memory device;
   irreversibly breaking down the first subset by applying a first programming voltage to the first subset for a first predetermined amount of time;
   reading a selected magnetic memory cell of the magnetic memory device by passing a read current through the selected magnetic memory cell to a bit line associated with the selected magnetic memory cell; and
   reprogramming the magnetic memory device, wherein said reprogramming includes:
      applying the first programming voltage for the first predetermined amount of time to magnetic memory cells not in the first subset; and
      applying a second programming voltage that is greater than the first programming voltage to a second subset of magnetic memory cells for a second predetermined amount of time.

2. The method of claim 1, wherein said reading further comprises passing the read current through a magneto-resistive element of the selected magnetic memory cell.

3. The method of claim 1, wherein said reading further comprises passing the read current through a Magnetic Tunnel Junction (MTJ) of the selected magnetic memory cell.

4. The method of claim 1, wherein said reading further comprises passing the read current through a diode of the selected magnetic memory cell to the bit line associated with the selected magnetic memory cell.

5. The method of claim 1, wherein said reading further comprises applying a read voltage to the selected magnetic memory cell that is less than the first programming voltage.

6. The method of claim 1, wherein said irreversibly breaking down the first subset comprises:
   selecting a magnetic memory cell from the first subset;
   grounding a bit line associated with the selected magnetic memory cell from the first subset;
   permitting other bit lines of the magnetic memory device to float;
   applying the first programming voltage to a word line associated with the selected magnetic memory cell from the first subset; and
   grounding other word lines of the magnetic memory device.

7. The method of claim 1, wherein the first programming voltage is greater than a supply voltage of the magnetic memory device.

8. A magnetic memory device, comprising:
   a plurality of word lines;
   a plurality of bit lines; and
   a plurality of magneto-resistive elements, wherein each magneto-resistive element is coupled between a respective word line from the plurality of word lines and a respective bit line from the plurality of bit lines;
   wherein each magneto-resistive element has a characteristic default resistance and a characteristic first altered resistance associated with an irreversible break down of the magneto-resistive elements due to being subjected to a first programming voltage for a first predetermined amount of time; and
   wherein each magneto-resistive element has a characteristic second altered resistance associated with a further irreversible break down of the magneto-resistive element due to being subjected to a second programming voltage for a second predetermined amount of time after being subjected to the first programming voltage for the first predetermined amount of time.

9. The magnetic memory device of claim 8, wherein each magneto-resistive element comprises a Magnetic Tunnel Junction (MTJ).

10. The magnetic memory device of claim 8, wherein the default resistance of each magneto-resistive element corresponds to a resistance of the respective magneto-resistive as manufactured.

11. The magnetic memory device of claim 8, wherein:
   each magneto-resistive element has a respective diode; and
   each magneto-resistive element and its respective diode are coupled in series between a respective word line from the plurality of word lines and a respective bit line from the plurality of bit lines.

12. The magnetic memory device of claim 8, further comprising:
   a first pin configured to receive a supply voltage; and
   a second pin configured to receive a programming voltage greater than the supply voltage, wherein the programming voltage received via the second pin is configured to be employed to provide the first programming voltage.

13. A method for operating a magnetic memory device, the method comprising:

programming the magnetic memory device by applying a first programming voltage to a first subset of magnetic memory cells for a first predetermined amount of time, wherein said applying a first programming voltage irreversibly reduces a respective resistance of each magnetic memory cell of the first subset; and reprogramming the magnetic memory device, wherein said reprogramming includes:

applying the first programming voltage for the first predetermined amount of time to magnetic memory cells not in the first subset; and applying a second programming voltage that is greater than the first programming voltage to a second subset of magnetic memory cells for a second predetermined amount of time to further irreversibly reduce the respective resistance of each magnetic memory cell in the second subset.

14. The method of claim 13, further comprising reading a selected magnetic memory cell of the magnetic memory device by passing a read current through a diode of the selected magnetic memory cell to a bit line associated with the selected magnetic memory cell.

15. The method of claim 14, wherein said reading further comprises passing the read current through a magneto-resistive element of the selected magnetic memory cell.

16. The method of claim 14, wherein said reading further comprises passing the read current through a Magnetic Tunnel Junction (MTJ) of the selected magnetic memory cell.

17. The method of claim 14, wherein said reading further comprises applying a read voltage to the selected magnetic memory cell that is less than the first programming voltage.

18. The method of claim 13, wherein said programming comprises:

selecting a magnetic memory cell from the first subset;

grounding a bit line associated with the selected magnetic memory cell from the first subset;

permitting other bit lines of the magnetic memory device to float;

applying the first programming voltage to a word line associated with the selected magnetic memory cell from the first subset; and grounding other word lines of the magnetic memory device.

19. The method of claim 13, wherein the first programming voltage is greater than a supply voltage of the magnetic memory device.

* * * * *